Feb. 1, 1966 F. B. HAGEDORN 3,233,199

CRYOTRON GATE STRUCTURE

Filed Oct. 1, 1962

INVENTOR
F. B. HAGEDORN
BY
Sylvan Sherman
ATTORNEY

United States Patent Office 3,233,199
Patented Feb. 1, 1966

3,233,199
CRYOTRON GATE STRUCTURE

Fred B. Hagedorn, Berkeley Heights, N.J., assignor to Bell Telephone Laboratories, Incorporated, New York, N.Y., a corporation of New York Filed Oct. 1, 1962, Ser. No. 227,460
6 Claims. (Cl. 338—32)

This invention relates to thin film superconductors and more specifically to thin film cryotron structures.

The phenomenon of superconductivity has, in recent years, been exploited to realize logic circuits and other electrical devices. The basic building block for such superconducting circuits is the cryotron, first described by D. A. Buck in an article entitled "The Cryotron—A Superconductive Computer Component," Proceedings of the Institute of Radio Engineers, volume 44, pages 482–493, April 1956. In its simplest form, a cryotron is a superconductor whose state (either superconducting or normal conducting) is determined by a current flowing in another superconductor. The superconductor which carries the current to be controlled is termed the "cryotron gate," or simply the "gate." The superconductor which carries the controlling current is termed the "cryotron control," or the "control."

A few years after the invention of the wire-wound cryotron, the thin film cryotron was developed. (For a discussion of this device, see the article "Thin-Film Cryotrons" by C. R. Smallman, A. E. Slade and M. L. Cohen, Proceedings of the Institute of Radio Engineers, volume 48, No. 9, pages 1562–1582, September 1960.) The thin film cryotron, due to its mechanical simplicity and capability for high-speed operation is preferred in most superconducting logic circuits.

As their name implies, these cryotrons are fabricated of thin films or "strips" of superconducting material rather than wires. A first strip of superconducting material serves as the cryotron gate and a second strip of a different superconducting material, disposed so that one of its broad surfaces is adjacent to an insulated from a broad surface of the gate, serves as the cryotron control. These strips and the insulating films separating them are generally deposited on a substrate by evaporation. Many fabrication techniques are known in the art and utilized with varying degrees of success. Each of these methods, however, requires that each superconducting or insulating film be deposited layer by layer on the substrate. Suitable "masks" with openings outlining the shape of each layer of insulating material or superconducting strip are placed over the substrate and the material deposited onto it in a vacuum.

Due to the fringing effect of the mask, and other surface irregularities, however, nonuniformities or irregularities frequently occur at the edges of the deposited strips. Such edge irregularities, in turn, tend to make reproducible characteristics difficult to achieve in cryotron structures. These irregularities also tend to decrease the usefulness of the cryotrons. More specifically, the irregularities at the edges of the gate structure cause these regions to "quench" or revert to their normal conducting state when the current density of the gate is substantially less than the intrinsic critical current density of the gate material. As a consequence, resistive heating takes place which causes more of the gate to quench, until all of it has reverted to its normal conducting state. This process, termed "thermal run-away," causes the overall current-carrying capacity of the gate to be decreased substantially below its theoretical value.

It is, therefore, an object of the present invention to provide thin film gate structures whose current-carrying capacity is substantially independent of edge irregularities.

Some attempts have been made in the prior art to overcome the undesirable characteristics caused by edge irregularities. One such method is disclosed in British Patent No. 889,729, published February 21, 1962. That invention includes the step of physically removing a thin margin from the edges of the crytron gate by milling, scraping, grinding or similar means. This method overcomes these undesirable characteristics by simply eliminating the edge irregularities. This process, however, requires careful and precise manufacturing operations and may not be economically feasible in some applications.

Another method is described in an article by H. H. Edwards and V. L. Newhouse entitled "Superconducting Film Geometry With Strong Critical Current Asymmetry" in the Journal of Applied Physics, volume 33, No. 3, pages 868–874, March 1962. This method utilizes two current-carrying conductors placed parallel to the edges of a superconducting film such as a cryotron gate. This method reduces the effect of edge irregularities at the expense of additional circuit elements and additional power.

It is, therefore, a more specific object of the present invention to increase the current-carrying capacity of a thin film gate without utilizing additional external circuitry or power sources.

In accordance with the principles of the present invention, a novel gate geometry is employed to establish a nonuniform current distribution across the width of the thin film gate. By changing the current distribution so that it is substantially zero near the edges of the film, the effect of edge irregularities is substantially eliminated. The current density in the center region of the gate strip can then be increased to the maximum determined by the critical current density of the material without causing the gate to quench prematurely.

The above-mentioned and other features and objects of the present invention will become more apparent by reference to the following description taken in conjunction with the accompanying drawings, in which.

Figure 1:
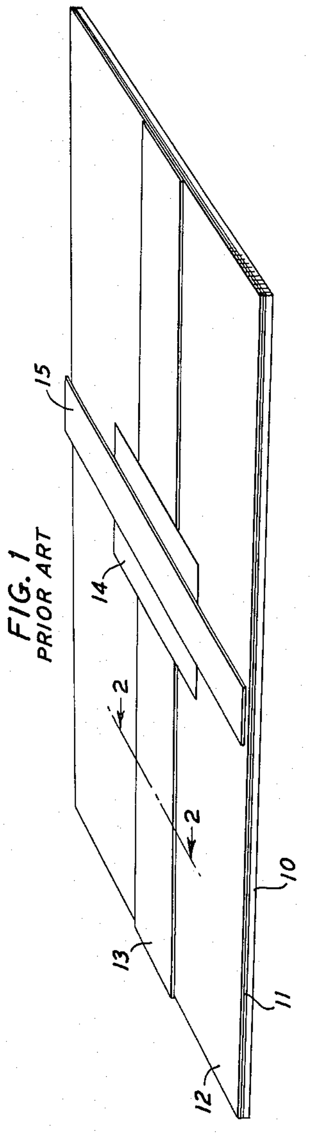
FIG. 1 is a pictorial view of a simplified thin-film cryotron in accordance with the teachings of the prior art.

Referring more particularly to the drawings, FIG. 1 is a pictorial representation of a simplified thin-film cryotron constructed in accordance with the teachings of the prior art. Such a cryotron comprises a substrate material 10, generally a flat plane of glass, quartz, aluminum or other suitabfle support material, upon which there is deposited a film of superconducting material 11, commonly referred to as a "ground plane." A film of dielectric insulating material 12 is then deposited on ground plane 11, thereby forming a "sandwich," in which the superconducting ground plane is in the center.

A thin strip of superconducting material 13 having a given set of electrical properties is then deposited on the dielectric film 12. As mentioned above, this strip is the cryotron gate and is intended to carry the current to be controlled. A second film of dielectric insulating material 14 is then deposited over either all, or a portion of the gate strip. Finally, another thin strip of superconducting material 15 having electrical properties different than those of the gate strip is deposited across dielectric film 14 so that it crosses over the gate film strip at an angle, shown here as a right angle. Strip 15 carries the controlling current and, as mentioned above, is termed the cryotron control.

In a cryotron, including that of FIG. 1, the application of a control current is arranged to establish a magnetic field in the gate material of a magnitude sufficient to destroy the phenomenon of superconductivity. It is desirable, however, that the cryotron control remain superconducting at all times. For this reason, the materials utilized in fabricating the gate and control generally have different superconducting properties. Specifically, the critical current density and the critical magnetic field value for the control material is substantially greater than the corresponding values of the gate material. From a theoretical standpoint the values of critical field and critical surface current density for the control material can be two or more times the corresponding values for the gate material, however, in practice, a ratio of ten or more is preferred. When dealing with thin film strips, it is convenient to speak in terms of surface current density (i.e., the current flowing in a unit width of the strip), rather than in terms of the more conventional area current density. When utilizing this terminology in connection with practical thin film cryotrons wherein the film thickness is several times the superconducting penetration depth, the critical surface current density and critical magnetic field of a material are dimensionally equivalent and substantially equal in magnitude.

A typical material used in the fabrication of thin film cryotron gates is tin, which has a critical surface current density and critical magnetic field on the order of four amperes per millimeter at an operating temperature of 3.4 degrees Kelvin. Lead, a typical material utilized for the ground plane and the cryotron control has a critical surface current density and critical magnetic field on the order of 50 amperes per millimeter also at 3.4 degrees Kelvin. The dielectric insulating films utilized to provide electrical insulation between the various conducting films of the cryotron can be fabricated of silicon monoxide or any other suitable materials known in the art.

Because of the choice of materials, the control remains superconducting while conducting a current sufficient to produce a magnetic field having a magnitude greater than that of the critical field of the gate. One indication of the performance of a cryotron is in its "current gain," defined as the maximum current the gate can carry without quenching divided by the minimum current in the control necessary to quench the gate. It is seen, therefore, that the maximum current a gate can carry without quenching has a direct bearing on the usefulness of a given cryotron. As pointed out hereinabove, it has been found that this maximum gate current is substantially reduced by irregularities and imperfections in the edges of thin film superconducting strips.

Figure 2:
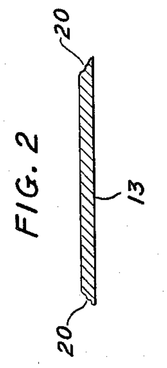
FIG. 2 is a sectional view showing a typical cross section of the cryotron gate of FIG. 1.

FIG. 2 is a cross-sectional view of gate strip 12 of FIG. 1. This drawing provides a somewhat exaggerated illustration of the irregularities at the edges 20 of strip 13 which tends to reduce the maximum gate current, as mentioned above. In addition to the reduction in film thickness near the edges caused by fringing effects during the film evaporation process, other irregularities can exist. For example, the longitudinal margin of the gate frequently has a somewhat "scalloped" or "wavy" outline which also tends to limit the maximum gate current.

Figure 3:
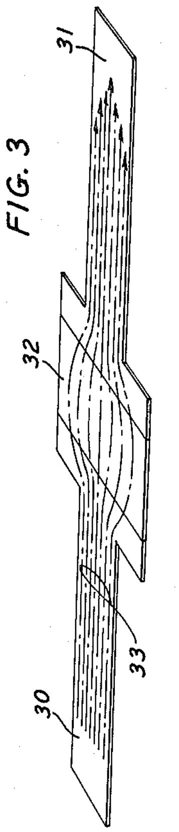
FIG. 3 is a pictorial view of a cryotron gate in accordance with the teachings of the present invention.

FIG. 3 shows, in a pictorial view, one embodiment of the present invention intended to improve the performance of thin film cryotron gates. In FIG. 3, a composite gate strip is composed of two thin film end members 30 and 31, which abut against a thin film center member 32. End members 30 and 31 have transverse widths which increase abruptly near the points where they abut against center member 32. The wide regions of end members 30 and 31 and center member 32 are preferably two to four times wider than the narrow regions of members 30 and 31. If this ratio of strip widths is too small, the effect of edge irregularities at the edges of center member 32 will not be satisfactorily eliminated. On the other hand, if the ratio of strip widths is made too great, the excess circuit inductance thereby added will reduce the high-speed operation of the gate. Members 30 and 31 advantageously are of the same material as the cryotron control or of a different material having similar superconducting characteristics. Center member 32, which is the operating portion of the gate structure, is fabricated of a material having similar characteristics to those of gate 13 described hereinabove (i.e., a lower critical current than the cryotron control).

In accordance with the invention, the gate structure of FIG. 3 is utilized in a thin film cryotron replacing the gate structure 13 shown in FIG. 1. The control is disposed so that it crosses the gate in the region of center member 32.

In operation the cryotron gate of FIG. 3 substantially reduces the effects of the irregularities at the edges of the strip by redistributing the current across the strip so that there is a minimum current density near the edges. Flow lines 33 indicate the approximate distribution of the current in the gate when it is in its superconducting state. The abrupt width change causes the ordinarily uniform current "streamlines" to diverge in end member 30 in the region where it abuts against center member 32 and to converge again in end member 31. Preferably, the width of center member 32 is from one to ten times its length. Due to this short longitudinal extent of center member 32 the current does not have an opportunity to re-establish a uniform distribution within center member 32. Thus, the current density across a transverse section of center member 32 tends to be greater near its center and to diminish near the edges. As a result, the overall current-carrying capacity, and therefore, the current gain of a cryotron utilizing the gate structure of FIG. 3 can be substantially increased since, as mentioned above, it is generally the current density along the edges of the strip and not in the center that causes premature quenching.

It is apparent that if the length of center member 32 is too great (for example, greater than its width) the current flow lines will have an opportunity to diverge therein and as a result the effectiveness of the gate will be decreased. On the other hand, if the length of this member is too small (i.e., less than one-tenth its width) the resistance of the gate in its normal conducting state will be decreased, again limiting its effectiveness.

It is obvious that the surface current density in end members 30 and 31 is substantially uniform in their narrower regions. This fact together with the fact that they also exhibit edge irregularities indicates that their total current carrying capacity is lower than that which is predicted from theory. For this reason, these members are fabricated from a material having a higher intrinsic surface current density than the material of center member 32. Therefore, the critical current for end members 30 and 31, taking into consideration the effect of edge irregularities, is greater than that of center member 32.

Figure 4:
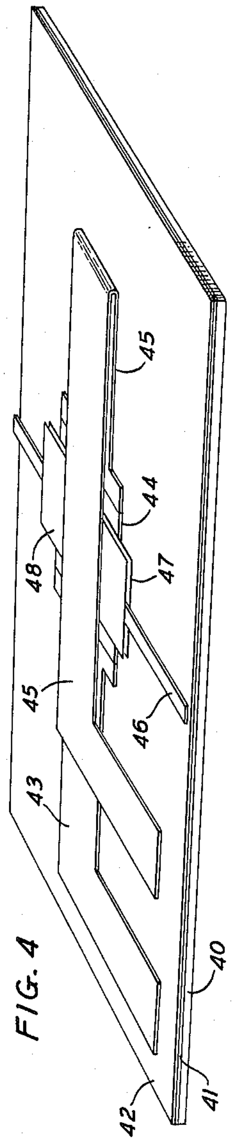
FIG. 4 is a pictorial view of a simplified cryotron structure utilizing another embodiment of the present invention.

FIG. 4 is a pictorial view of a simplified cryotron utilizing another embodiment of the present invention. As in the prior art device, the cryotron illustrated in FIG. 4 comprises a substrate 40, ground plane 41, dielectric insulating film 42 and the cryotron gate and control. The gate is similar to that of FIG. 3 in that it has three serially connected members, 43, 44 and 45. End member 43 widens near the point where it abuts against center member 44. End member 45 is also wider at the point where it abuts against center member 44 and is narrower over the remainder of its length. In this embodiment, the width of center member 44 can be from ten to several hundred percent larger than the narrower regions of members 43 and 45.

Unlike the embodiment of FIG. 3, however, end member 45 of the gate doubles back over center member 44 so that the overall gate is in the shape of an elongated U. The cryotron control consists of a thin film strip 46 insulated from the gate by dielectric insulating films 47 and 48. Although other control configurations are well known in the art and can be utilized, for the sake of simplicity the single crossed film control is illustrated herein. Control 46 passes through the opening formed by the U-shaped gate in the vicinity of center member 44. For the purposes of simplicity and clarity, dielectric insulating films 47 and 48 are shown extending only over the region where control 46 crosses the gate. These insulating films would, in practice, extend over the entire length of the opening in the U-shaped gate to insulate the two legs of the U from one another.

End members 43 and 45 are shown with a right angle bend at their respective terminal ends. These bends merely serve to separate the two end points so that connections to an external circuit, not shown, can be more readily made. As in the previous embodiment, end members 43 and 45 are of a superconducting material having electrical superconducting properties similar to those of the control material (i.e., a critical field and a critical current density substantially greater than that of center region 44).

The principle of operation of the gate structure of FIG. 4 can be understood by considering the electrodynamics of adjacent superconducting strips of different widths. When two superconducting strips of different widths are disposed so that their axes are substantially parallel and their broad adjacent surfaces support electrical current flowing in opposite directions, a nonuniform current distribution results in the wider strip. For example, in the gate of FIG. 4, substantially all the gate current through the wide center member 44 is constrained to flow in the region directly below end member 45. Thus, the current density in the center member 44 is substantially zero in the vicinity of its edges. The effects of nonuniformities and irregularities at the edges of member 44 are thereby avoided.

The principle of operation upon which the gate structure of FIG. 4 depends allows a wide range of modifications. For example, end member 43 can have a width equal to that of center member 44 and uniform over its entire length. Also, the width change in end member 45 can take place at any point as long as its width directly above center member 44 is less than the width of that member.

In all cases it is understood that the above-described arrangements are illustrative of but a small number of the many possible specific embodiments which can represent applications of the principles of this invention. Numerous and varied other arrangements can readily be devised by those skilled in the art without departing from the spirit and scope of this invention.

What is claimed is:

1. A thin film cryotron consisting of a control element and a gate, said gate comprising, in combination, first, second and third strips of superconducting material disposed in longitudinal succession, one end of each of said first and third strips abutting against and conductively connected to the respective ends of said second strip, said first and third strips having a width which increases at least two to four times in the vicinity of their abutting connection with said second strip, said second strip having a width substantially equal to said increased width of said first and second strips and a length equal to or less than said increased width, and wherein the material of said first and third strips has critical current density and critical magnetic field values substantially greater than the material of said second strip.

2. The cryotron according to claim 1 wherein the material of said first and third strips is lead and the material of said second strip is tin.

3. A thin film cryotron consisting of a control element and a gate, said gate comprising, in combination, first, second and third strips of superconducting material disposed in longitudinal succession, a first end of each of said first and third strips abutting against and conductively connected to the respective ends of said second strip, a portion of said third strip in the vicinity of the second end thereof being doubled back, so that one broad surface thereof is adjacent to and coextensive with a broad surface of said second strip, said doubled-back region of said third strip having a width that is narrower than that of said second strip, and the material of said first and third strips having a critical current density and a critical magnetic field greater than those of said second strip.

4. The cryotron according to claim 3 wherein the material of said first and third strips is lead and the material of said second strip is tin.

5. In combination, a first thin film superconducting strip having a given width, means for causing current to flow in only a portion of said given width, said means comprising a second thin film superconducting strip having a width substantially equal to said portion of said given width, said second strip having a surface thereof adjacent to a surface of said first strip, said first and said second strip being conductively connected together to carry current in opposite directions, and means for switching said second section between said superconducting state and a normal conducting state.

6. The combination according to claim 5 wherein the critical current density and the critical magnetic field values of said first strip are less than those of said second strip.

References Cited by the Examiner

UNITED STATES PATENTS

| | | | |
|---|---|---|---|
| 2,966,647 | 12/1960 | Lentz | 338—32 |
| 2,989,716 | 6/1961 | Brennemann | 338—32 |
| 3,059,196 | 10/1962 | Lentz | 338—32 |
| 3,076,102 | 1/1963 | Newhouse et al. | 338—32 |
| 3,086,130 | 4/1963 | Meyers et al. | 340—173.1 X |
| 3,090,023 | 5/1963 | Brenemann et al. | 340—173.1 X |
| 3,158,502 | 11/1964 | Bremer | 338—32 X |

RICHARD M. WOOD, *Primary Examiner.*